United States Patent
Gaitonde et al.

(10) Patent No.: US 12,411,168 B2
(45) Date of Patent: Sep. 9, 2025

(54) SOFTWARE DEFINED DEVICE VARIANTS

(71) Applicant: XILINX, INC., San Jose, CA (US)

(72) Inventors: Dinesh D. Gaitonde, Fremont, CA (US); Matthew H. Klein, Redwood City, CA (US); Himanshu Verma, Sunnyvale, CA (US); Chirag Ravishankar, Erie, CO (US); Maithilee Rajendra Kulkarni, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 236 days.

(21) Appl. No.: 18/128,947

(22) Filed: Mar. 30, 2023

(65) Prior Publication Data
US 2024/0329126 A1    Oct. 3, 2024

(51) Int. Cl.
*G01R 31/28* (2006.01)
(52) U.S. Cl.
CPC ....... *G01R 31/2896* (2013.01); *G01R 31/287* (2013.01)

(58) Field of Classification Search
None
See application file for complete search history.

(56) References Cited

U.S. PATENT DOCUMENTS

| | | | |
|---|---|---|---|
| 9,012,245 B1 | 4/2015 | Klein et al. | |
| 9,104,825 B1* | 8/2015 | Scatchard | G06F 30/3312 |
| 11,002,633 B2* | 5/2021 | Correia | G01M 13/00 |
| 11,243,142 B2* | 2/2022 | Correia | F03D 17/00 |
| 11,281,195 B2* | 3/2022 | Daxer | G05B 19/41875 |
| 2008/0229143 A1* | 9/2008 | Muraki | G06F 11/2028 714/3 |
| 2020/0356468 A1* | 11/2020 | Fugate | G06F 11/3688 |

* cited by examiner

*Primary Examiner* — Jermele M Hollington
(74) *Attorney, Agent, or Firm* — Patterson + Sheridan, LLP

(57) ABSTRACT

Embodiments herein describe assigning integrated circuits with defects as variants of the integrated circuit design. Each variant can deactivate different circuitry in the integrated circuit design. A location of the defect can be matched to a variant that has a deactivated region that covers the defect. The integrated circuit can then be assigned to that variant.

20 Claims, 5 Drawing Sheets

SOFTWARE DEFINED DEVICE VARIANTS

TECHNICAL FIELD

Examples of the present disclosure generally relate to assigning or binning integrated circuits with hardware defects into device variants.

BACKGROUND

As transistor sizes shrink and manufacturing processes become more complex, the costs (both mask and wafer costs) to produce integrated circuits (or devices made from multiple integrated circuits) increase. One of the main reasons for raising costs is attributed to the defect density during manufacturing caused by random variation or particles introduced during the process. A single defect that shorts or opens a transistor can affect the functionality of the respective component and therefore cannot be sold as a fully functional integrated circuit. A key feature of field programmable gate arrays (FPGA) is field programmability which is managed through configuration memory cells (e.g., RAM) that are programmed with a bitstream. The configuration memory cells are a large part of the die area and are more likely to have defects than other types of circuitry, affecting yield substantially.

Being able to still sell an integrated circuit that has one or two defects (albeit with a lower performance than a fully functional device) can greatly mitigate the costs associated with defective integrated circuits.

SUMMARY

One example is a method that includes identifying a defect in an integrated circuit (IC), identifying a first variant of a plurality of variants of the IC that includes a deactivated region that covers the defect where each of the plurality of variants include a plurality of deactivated regions that are non-contiguous and where a size of each of the plurality of deactivated regions permit signals to be routed through each of the plurality of deactivated regions, and assigning the IC to the first variant.

Another embodiment described herein is a system that includes a processor and a memory storing an application which, when executed by the processor, performs an operation. The operation includes identifying a defect in an integrated circuit (IC), identifying a first variant of a plurality of variants of the IC that includes a deactivated region that covers the defect where each of the plurality of variants include a plurality of deactivated regions that are non-contiguous and where a size of each of the plurality of deactivated regions permit signals to be routed through each of the plurality of deactivated regions, and assigning the IC to the first variant.

Another embodiment described herein is a non-transitory computer readable storage medium encoding instructions, which, when executed by a processor, perform an operation. The operation includes identifying a defect in an integrated circuit (IC), identifying a first variant of a plurality of variants of the IC that includes a deactivated region that covers the defect where each of the plurality of variants include a plurality of deactivated regions that are non-contiguous and where a size of each of the plurality of deactivated regions permit signals to be routed through each of the plurality of deactivated regions, and assigning the IC to the first variant.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
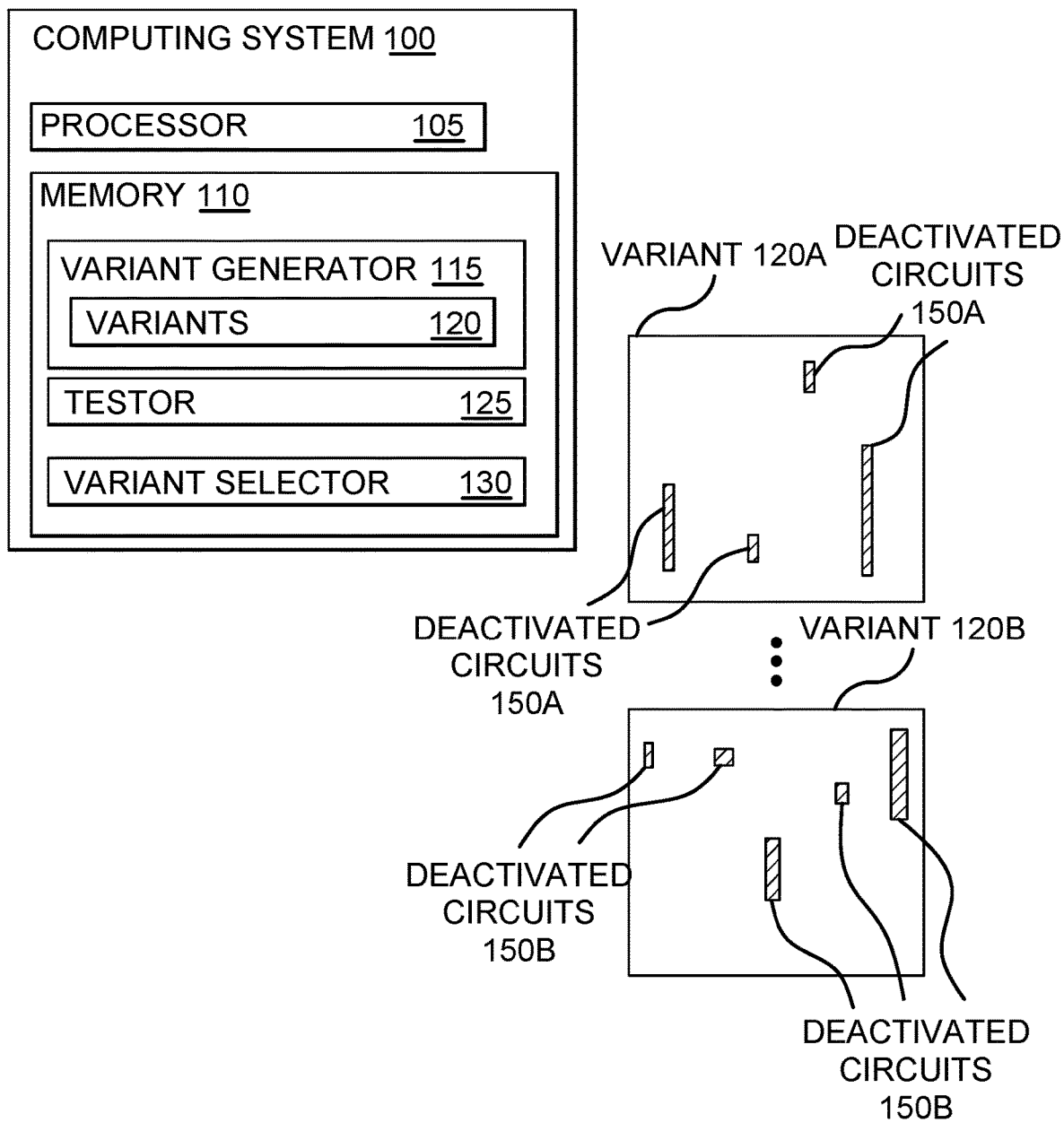
FIG. 1 illustrates a computing system for assigning defective integrated circuits into variants, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe assigning integrated circuits with defects as variants of the integrated circuit design. Each variant can deactivate different circuitry in the integrated circuit design. For example, if there are ten variants, each variant can deactivate 10% of the circuitry in the design. In one embodiment, each variant deactivates different circuitry so that the union of the deactivated circuitry of the variants equals the total circuitry in the integrated circuit design (or close to it).

If testing an integrated circuit identified one or more errors, a variant selector can identify which of the variants has deactivated circuitry that would include the error. For example, if the error occurs in a configuration memory at a certain location of the integrated circuit, the variant selector identifies which of the variants has deactivated the circuitry at that location. The variant selector can then assign (or categorize or bin) the integrated circuit to that variant.

In one embodiment, the deactivated regions of circuitry in a particular variant are selected so that they do not affect routability. That is, prior solutions deactivated large chunks of circuitry. If hardware blocks on either side of a deactivated chunk want to talk to each other, they must route around the deactivated chunk. In contrast, the embodiments herein can deactivate circuitry without deactivating routing circuitry that permits signals to route across (or through) the deactivated circuitry. In this manner, deactivating circuitry has little to no effect on routability between active regions of circuitry in the variant.

FIG. 1 illustrates a computing system 100 for assigning defective integrated circuits into variants, according to an example. The computing system 100 includes a processor 105 which represents any number of processing elements with any number of processing cores. In one embodiment, the computing system 100 is a server, laptop, desktop, etc. where the processor 105 is one or more central processing units (CPUs). In another embodiment, the computing system 100 may be a data center or cloud computing environment.

The memory 110 can include volatile memory elements, non-volatile memory elements, and combinations thereof. In this example, the memory 110 includes software applications, such as a variant generator 115, a testor 125, and a variant selector 130.

The variant generator 115 can design variants 120 for a particular design for an integrated circuit (IC). The IC can be an FPGA, Coarse Grain Reconfigurable Architecture (CGRA), system on a chip (SoC), or application specific integrated circuit (ASIC). In one embodiment, the IC has repeated hardware blocks, such as columns or rows of circuitry that repeat.

In one embodiment, a user may indicate how many variants to create for a IC design. Creating more variants 120 may mean less circuitry is deactivated in each variant, and thus, the variants have a performance that more closely matches the performance of a fully functional IC. However, more variants 120 also increase the difficulty of creating software tools that can configure all the different variants 120. Additionally, the smaller the defective area allowed by a variant becomes it is more difficult to generate material to satisfy it and also a single defect may produce an unusable area bigger than that which can be satisfied by the variant or difficult to isolate to such a small defect area meeting the variant description FIG. 1 illustrates two variants 120A and 120B. The variant 120A includes deactivated circuits 150A which is circuitry that is intentionally not operational or deactivated when the IC variant 120A is powered on. The remaining circuitry and hardware in the variant 120A is operational or usable when the IC is powered on. The variant 120B includes deactivated circuits 150B which is circuitry that is intentionally not operational or deactivated when the IC variant 120A is powered on. The remaining circuitry and hardware in the variant 120B is operational or usable when the IC is powered on.

In this embodiment, the deactivated circuits 150A in the variant 120A includes different deactivated circuits 150B in the variant 120B. That is, the deactivated circuitry 150 in the variants 120A and 120B is non-overlapping. In one embodiment, each variant 120 of an IC design has different, non-overlapping deactivated circuitry. In that case, the union (or combination) of the deactivated circuitry for each of the variants may be the total circuitry in the IC. However, there may be some circuitry in an IC design that is not deactivated in any of the variants. For example, there may be some circuitry which is critical (e.g., a processor or some interconnect resources) and should not be deactivated, or some circuitry where errors almost never occur. This circuitry may be excluded from being deactivated in any of the variants. If a defect does happen to occur in this excluded circuitry, the IC may be discarded rather than being sold as a variant. As such, in those embodiments, the union of the deactivated circuitry across the variants may not include all the circuitry or all of the area of the IC.

While FIG. 1 illustrates two variants 120, the IC design may have any number of variants. As mentioned above, the number of variants can be a design choice that balances the performance of the variants with the complexity added to the compilation and routing tools used to configure the variants as well as added complexity with inventory management.

The testor 125 can be any application or system that tests an IC to identify defects. The embodiments are not limited to any particular testing method or system, but can be used with any testor 125 that can identify circuitry that has a defect in an IC.

If a testor 125 identifies a defect in an IC, the variant selector 130 can then compare the location of that defect with the deactivated circuitry 150 in the variants 120. For example, the variant selector 130 can determine whether the defect occurs in a location of the IC which corresponds to one of the deactivated circuits 150A in the variant 120A or in the deactivated circuits 150B in the variant 120B (or in some other variant). If so, the variant selector 130 assigns (or bins) the IC to that variant. This is discussed in more detail in FIG. 2.

Figure 2:
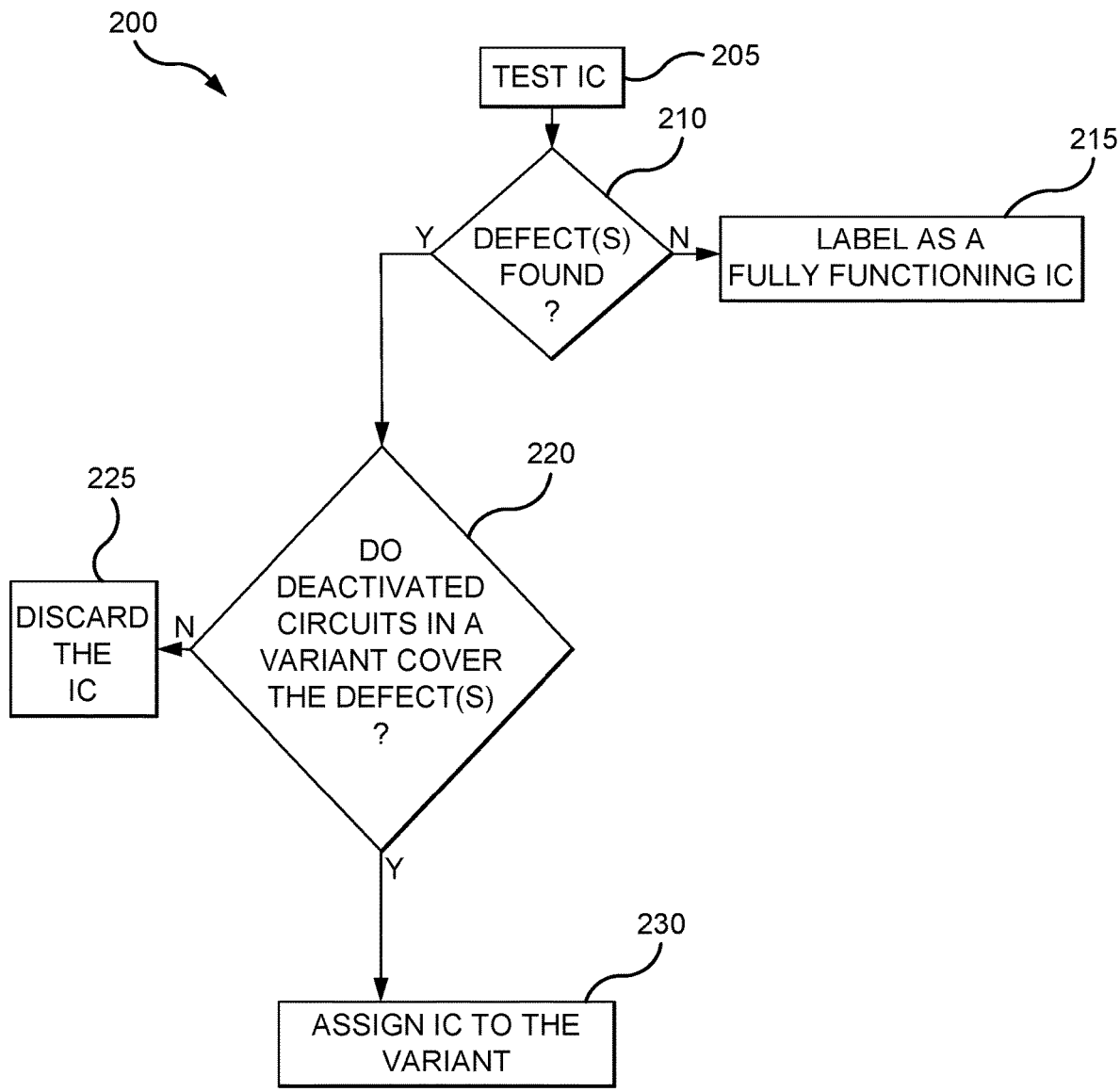
FIG. 2 is a flowchart for assigning defective integrated circuits into variants, according to an example.

FIG. 2 is a flowchart of a method 200 for assigning defective integrated circuits into variants, according to an example. At block 205, the testor tests an IC to identify any defects. While most of the ICs may be defect free, some have a defect, and even fewer ICs have multiple defects.

If the IC has no defects, the method 200 proceeds to block 215 where the variant selector labels (or bins) the IC as a fully functional IC. In one embodiment, each of the circuit blocks can be operational or used in the IC. That is, the IC does not have any deactivated circuits.

However, if the testor identifies at least one defect, the method 200 proceeds to block 220 where the variant selector determines whether deactivated circuits in a variant covers the defect. This can be seen in FIG. 3.

Figure 3:
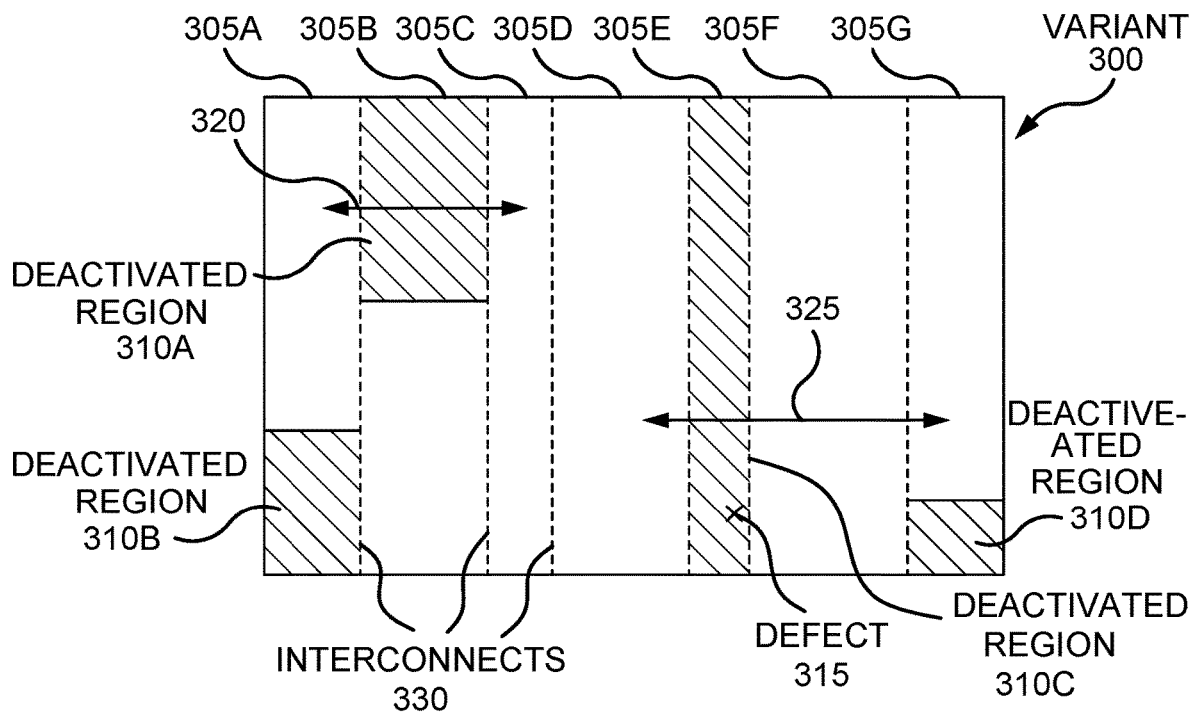
FIG. 3 illustrates deactivated regions of a variant of an integrated circuit, according to an example.

FIG. 3 illustrates deactivated regions 310 of a variant 300 of an IC, according to an example. That is, the deactivated regions 310 cover circuitry that is intentionally unused or is not operational when the variant 300 is powered on. In this example, the testor discovered a defect 315 in the deactivated region 310C. Thus, this particular variant 300 was selected from other variants of the same IC design because this variant 300 has a deactivated region 310C that covers or includes the defect 315. Because of this, when powered on, the defect 315 does not have a negative impact on the IC because the defect 315 is located in a region 310 that will not be used during operation of the IC.

Notably, there may not be defects in the other deactivated regions of the variant 300. That is, the deactivated regions 310A, 310B, and 310D may cover circuitry that does not have defects. Nonetheless, the regions 310 that do not contain defects are still disabled during operation. While this wastes usably circuitry, it also permits the software tools to know which portions of a variant 300 are disabled and which are enabled. Thus, in this embodiment, the software tools (e.g., compiler, placer, router, etc.) know to not use the deactivated regions 310 in the variant 300, regardless if those region 310 do or do not have the defect 315. This enables the software tools to configure the variant 300 regardless of which of the deactivated regions 310 contain the defect 315.

Returning to the method 200 in FIG. 2, if the variant selector identifies a variant that has a deactivated region that include the location of the defect, at block 230 the variant selector assigns (or bins) the IC to that variant. If multiple defects are found, in one embodiment, the variant selector attempts to find a variant with deactivated regions that cover both of these defects. Note, the probability of having multiple defects becomes increasingly less likely. However, as the number of defects increases, it is increasing more unlikely that there will be one variant with deactivated regions that cover each of the identified defects. If none of the variants for an IC design include deactivated regions that include each of the defects, the method 200 instead proceeds to block 225 where the IC is discarded.

The risk of having to discard an IC with multiple defects can be mitigated by using less variants where each variant deactivates more of the area of the IC. But this is a tradeoff with performance since the more circuitry that is deactivated, the larger the performance disparity between the variants and a fully functional IC. Further, defects are often spread uniformly throughout an IC. Thus, if multiple defects are identified, they are likely farther apart meaning it is less likely one variant will have deactivated regions that cover both defects. As such, a designer may choose to have more variants, which have smaller deactivated regions, and thus, performance that more closely matches the performance of the fully functional IC. However, this also means that it is less likely an IC with two or more defects can be assigned to a variant, thereby increasing yield loss. That being said, the probability of getting two defects also decreases dramatically as the area as a percent of the die area that is deactivated for a single variant decreases.

Returning to FIG. 3, this variant 300 includes deactivated regions 310 that are distributed throughout the IC. In previous solutions, an IC may deactivate a large chunk of circuitry (e.g., a contiguous block of circuitry that takes up a large portion of the circuitry, e.g., 10%). Here, assuming there are ten variants for an IC design, each variant may also deactivate 10% of the circuitry, but this circuitry is distributed throughout the IC (e.g., the deactivated regions 310 are non-contiguous) rather than being one contiguous block. This has several advantages. One, having distributed deactivated regions 310 means that it is easier for the usable circuitry near a deactivated region 310 to find substitute resources that may be in the deactivated region. For example, active circuitry (e.g., a processing element) near the deactivated region 310A may want to use a memory element in the deactivated region 310A. Since the active circuitry cannot use that memory element, it is easier for the software tools to find a replacement memory element since the deactivated region 310A is smaller, and thus, an activate memory element may be close by. Put differently, having smaller, distributed deactivated regions 310 makes it easier for the software tools to find replacement circuitry for the circuitry that is the deactivated regions 310.

Second, having smaller deactivated regions means it is easier for a router to route signals through the deactivated regions 310. In one embodiment, selecting a size of the deactivated regions 310 that do not affect routing may be a requirement or constraint used when generating the variants. For example, the arrows 320 and 325 illustrate where active circuitry disposed on opposite sides of a deactivated region 310 want to communicate. In this example, the sizes of deactivated region 310 are selected so that the activated circuitry can communicate through the deactivated regions 310. That is, while the logic circuitry is fully deactivated, the associated interconnect/routing blocks are not fully deactivated The portions of the interconnect that interface with the deactivated regions are deactivated while the portions of the interconnect that are used for general routing are not deactivated. In prior solutions, a router would have to route these communication lines around a deactivated region.

The deactivated regions 310 may not affect routability through the regions 310 because the portions of the interconnects 330 that permit circuitry to communicate at different locations in the chip may not be deactivated. In one embodiment, the interconnects 330 facilitate two types of connections: (i) connections to and from circuitry that neighbors the interconnects and (ii) connections between non-adjacent hardware resources in the IC. The portions of the interconnects 330 that connect to neighboring deactivated regions can also be deactivated; however, the portions of the interconnects 330 used to route traffic to non-adjacent circuitry can remain active. This permits the communication paths shown by the arrows 320 and 325, and as a result, the deactivated regions 310 can have a negligible impact on routability between the active circuitry in the variant.

In this example, the variant 300 is for an IC design that includes repeating columns 305. For example, each column 305 may include the same type of circuitry—e.g., memory, configurable logic blocks (CLB), compute engines, etc. However, neighboring columns may have different types of circuitry. For example the type of circuitry in column 305A may differ from the type of circuitry in column 305B. Further, there may be a repeating pattern of circuitry. For example, the columns 305A, 305C, 305E, and 305G may be one type of circuitry while the columns 305B, 305D, and 305F are another type of circuitry.

For instance, many FPGAs have a columnar architecture, where a certain type of component (e.g., CLB or RAM) is laid out in a column 305 and interfaced (on left and right sides) by columns of interconnect 330 used to transport data between the components. There can be some dedicated connectivity between the adjacent logical components such as cascade paths between adjacent RAMs to enable creating larger memory structures. The programmable interconnects 330 can be thought of as a sea of multiplexes and wires making connections between them. Bits on the multiplexers can be programmed to create a routing path between components. As discussed above, the interconnect resources can be classified into two types: (1) general resources used to connect between non-adjacent circuitry, such as interconnect tiles spanning certain physical distances (e.g., about 50% of area used by the interconnects 330) and (2) resourced dedicated to interface with the adjacent logical components (e.g., about 50% of area). For example, the first type of interconnect resources (e.g., interconnect tiles) enable the communication shown by the arrows 320 and 325 while the second type of interconnect resources only interface with directly adjacent columns. In one embodiment, defects on any of the logical FPGA components, as well as the second type of interconnect resources, can be tolerated since the second type of resource are deactivated as part of the deactivated regions 310. However, defects in the first type of interconnect resource may not be tolerated. That is, if a defect occurs there, the IC may be discarded. While an FPGA is specifically described, these embodiments can be used in other types of ICs such as CGRAs or ICs with repeated hardware structures such as the columns 305.

Figure 4:
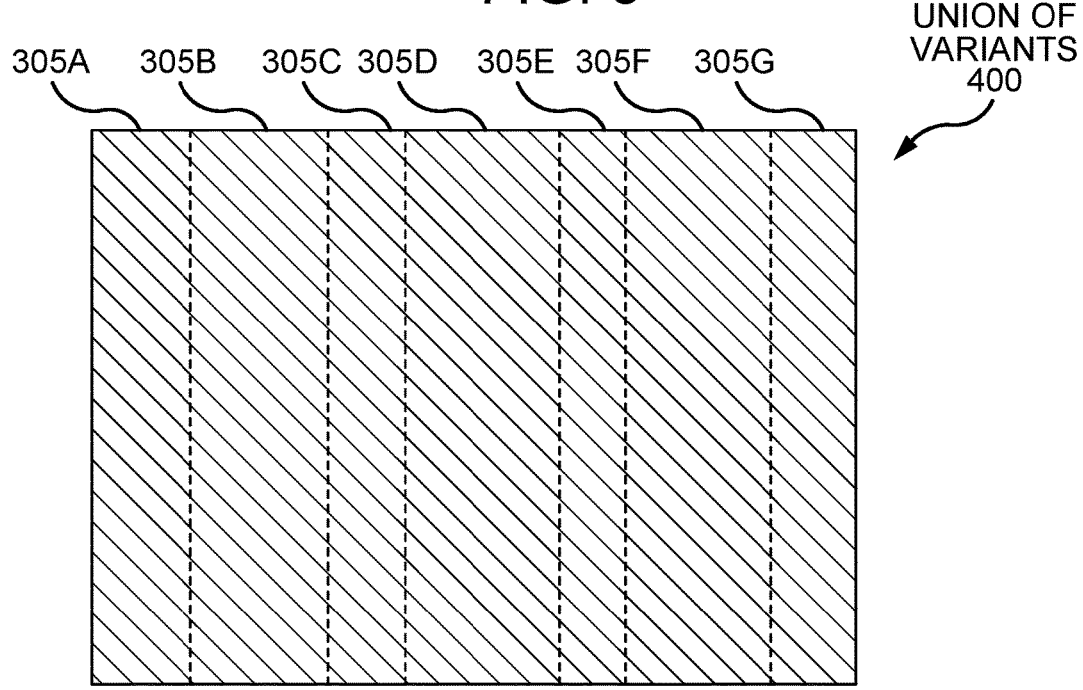
FIG. 4 illustrates a union of deactivated regions of the variants for a particular integrated circuit, according to an example.

FIG. 4 illustrates a union 400 of deactivated regions of the variants for a particular IC design, according to an example. That is, FIG. 4 illustrates combining the deactivated regions for all the variants of a particular IC design. As shown, the union 400 can cover the entire area of the IC. Thus, if a defect is located in any part of the IC, there is an least one variant that has a deactivated region that covers that defect.

Further, in one embodiment, each variant may include non-overlapping deactivated regions relative to the other variants. Put differently, each variant may have unique deactivated regions.

In one embodiment, each variant may deactivate a same or similar percentage of the circuitry in the IC. For example, if there are ten variants, each variant may deactivate regions that cover 10% of the circuitry in the IC. However, this is not a requirement, in other embodiments, two of the ten variants may deactivate 20% of the circuitry in the IC while the other eight variants deactivate 7.5% of the circuitry in the IC.

While FIG. 4 illustrates deactivated regions that essentially cover the entire IC, in other embodiments, there may be regions of the IC that are not deactivated in any of the variants. For example, the first type of interconnect resource discussed above may not be deactivated in any of the variants in order to maintain routability. Further, there may be special processors or IO elements that are no deactivated in the variants. As such, if there are any defects in these regions, the IC may be discarded rather than being binned as a variant.

Figure 5:
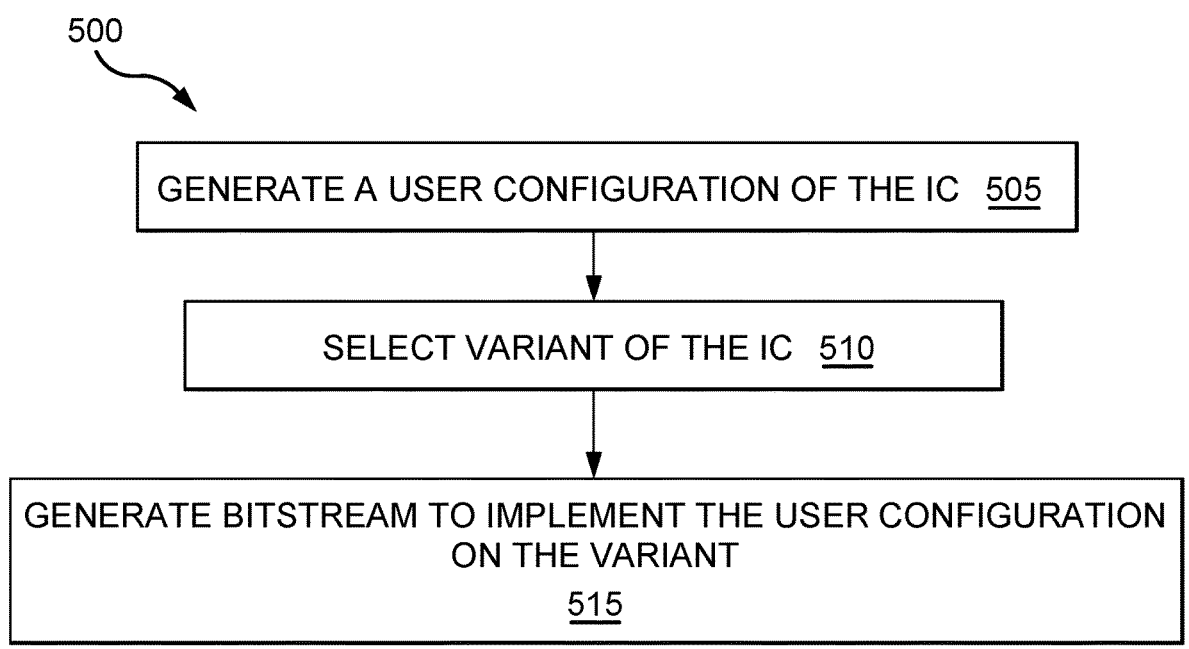
FIG. 5 is a flowchart for configuring a variant of an integrated circuit, according to an example.

FIG. 5 is a flowchart of a method 500 for configuring a variant of an integrated circuit, according to an example. In one embodiment, the method 500 can be performed by a customer who has purchased some number of a particular variant. For example, instead of purchasing a fully functional IC, the customer may have bought a variant, which has decreased performance but may, for example, have a discounted price. In one embodiment, the variants may have roughly the same performance as each other (assuming the variants deactivate the same percentage of the circuitry).

At block 505, customer generates a user configuration of the IC. That is, the user may use a programming tool to generate a configuration of the IC that performs the customer's desired functions or applications.

At block 510, the customer selects a variant of the IC. For example, the functions of the compiler/router/placer used to generate the user configuration varies depending on the variant. For example, by knowing the location of the deactivated regions (which depends on the particular variant), the placer knows where it can and cannot place user functions. Similarly, the router can route signals between active regions and not to circuitry in the deactivated regions.

At block 515, the software tool generates a bitstream to implement the user configuration on the variant of the IC. The bitstream can then configure the IC (e.g., load values in configuration memory cells or registers in the IC in the active regions). However, using a bitstream is just one example of implementing a user configuration on a variant of an IC.

So long as the software tools have been properly set up, the method 500 can be used to implement the same user configuration on any of the variants. That is, the particular bitstreams used to configure the different variants will likely vary, but performance of the same user configuration on different variants will likely be the same or close to the same.

Figure 6:
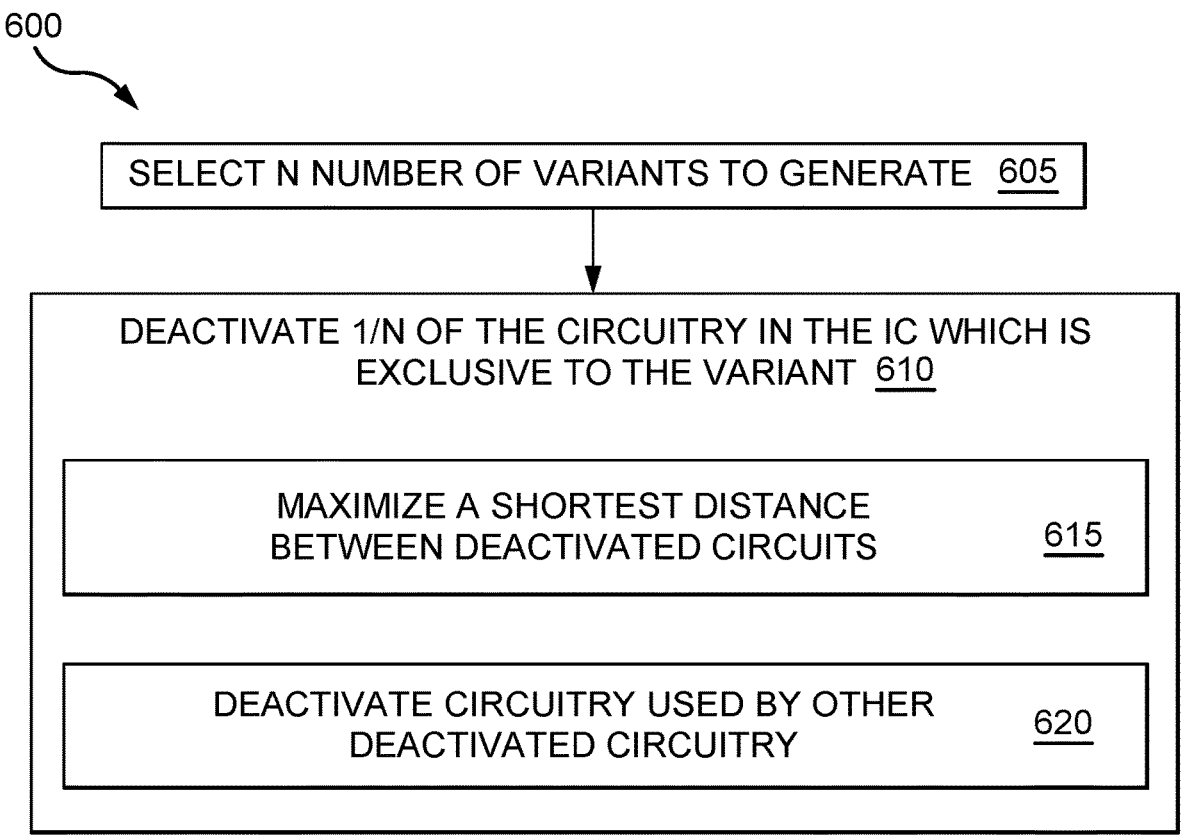
FIG. 6 is a flowchart for designing variants for an integrated circuit design, according to an example.

FIG. 6 is a flowchart of a method 600 for designing variants for an integrated circuit design, according to an example. At block 605, a designer can select N number of variants to generate. As discussed above, the number of variants can be a design choice that balances the performance of the variants with the complexity added to the compilation and routing tools used to configure the variants (e.g., the software tools used in method 500).

At block 610, the variant generator deactivates 1/N of the circuitry in the IC which is exclusive to the variant. That is, the variant generator selects deactivated regions that include 1/N of the circuitry in the IC. This can include all the circuitry in the IC, or there can be some circuitry that is not deactivated in any of the N number of variants (e.g., special interconnect resources or processors).

As part of deactivating 1/N of the circuitry, at block 615, the variant generator maximizes a shortest distance between deactivated circuits. For example, the variant generator may select locations of the deactivate regions where the shortest distance between those deactivated regions is maximized.

In one embodiment, the variant generator may use an Integer Linear Programming (ILP) formulation to maximize the shortest distance between deactivated circuitry. In one embodiment, the variant generator may start with deactivating RAM. However, these can be sparse resources, so the variant generator may not deactivate entire columns of these types of circuitry. In one embodiment, the variant generator limits the columns of deactivated circuitry to the height of half a clock region. The variant generator can use the ILP formation to maximize the shortest distance between the deactivated RAM with these constraints.

At block 620, the variant generator deactivates circuitry used by other deactivated circuitry. For example, after identifying the RAM to deactivate at block 615, the variant generator can then deactivate any DSP close to the deactivated RAM since they are often used together in customer applications.

Further, any interconnect resources that connect to the circuitry that was deactivated at blocks 615 and 612 can also be deactivated (e.g., the type of the interconnect resources are dedicated to interfacing with the deactivated circuitry).

As such, the embodiments above can be software defined with no required hardware or design implications. Further, fine grained deactivation can be achieved without loss of routability and minimal loss to Quality of Results (QoR)/critical path delay, and minimal power impact. Also, a prior characterization of the variants and associated software device model shipped to the customer can be achieved. Moreover, the customer and its application can be mapped to a specific variant, or a set of compatible variants.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:
   identifying a defect in an integrated circuit (IC);
   identifying a first variant of a plurality of predefined variants of the IC that includes a predefined deactivated region that covers the defect, wherein each of the plurality of predefined variants includes a plurality of predefined deactivated regions that are non-contiguous, wherein a size of each of the plurality of predefined deactivated regions permits signals to be routed through each of the plurality of predefined deactivated regions; and
   assigning the IC to the first variant.

2. The method of claim 1, wherein the IC comprises interconnect resources, wherein a first type of the interconnect resources is dedicated to interface with adjacent logical components and a second type of the interconnect resources is used to connect non-adjacent circuitry to each other, wherein the first type of interconnect resources are part of the plurality of predefined deactivated regions but the second type of interconnect resources are not.

3. The method of claim 2, wherein the second type of the interconnect resources comprises interconnect tiles used to connect non-adjacent circuitry, wherein the interconnect tiles permit signals to be routed through the plurality of predefined deactivated regions to active non-adjacent circuitry disposed on opposite sides of the plurality of predefined deactivated regions.

4. The method of claim 1, wherein the plurality of predefined deactivated regions in each of the plurality of predefined variants are non-overlapping with the plurality of predefined deactivated regions in each of the other plurality of predefined variants.

5. The method of claim 4, wherein a union of the plurality of predefined deactivated regions of the plurality of predefined variants covers an entire area of the IC, except for areas of the IC containing circuitry that is excluded from the plurality of predefined deactivated regions of each of the plurality of predefined variants.

6. The method of claim 5, further comprising:
identifying a defect in a second IC with a same design as the IC, wherein the defect is at a location of the second IC containing the circuitry that is excluded from the plurality of predefined deactivated regions of each of the plurality of predefined variants; and
discarding the second IC.

7. The method of claim 1, further comprising:
identifying two defects in a second IC with a same design as the IC; and
upon determining none of the plurality of predefined variants has a plurality of predefined deactivated regions that cover both of the defects, discarding the second IC.

8. The method of claim 1, further comprising:
identifying two defects in a second IC with a same design as the IC; and
upon determining that a second variant of the plurality of predefined variants has a plurality of predefined deactivated regions that cover both of the defects, assigning the second IC to the second variant.

9. The method of claim 1, wherein the IC includes a plurality of columns, where each of the plurality of columns comprises only one type of circuitry, wherein the plurality of predefined deactivated regions for each of the plurality of predefined variants are located within multiple ones of the plurality of columns.

10. The method of claim 9, wherein neighboring columns of the plurality of columns comprise different types of circuitry.

11. A system, comprising:
processor; and
memory storing an application which, when executed by the processor, performs an operation, the operation comprising:
identifying a defect in an integrated circuit (IC);
identifying a first variant of a plurality of predefined variants of the IC that includes a predefined deactivated region that covers the defect, wherein each of the plurality of predefined variants includes a plurality of predefined deactivated regions that are non-contiguous, wherein a size of each of the plurality of predefined deactivated regions permits signals to be routed through each of the plurality of predefined deactivated regions; and
assigning the IC to the first variant.

12. The system of claim 11, wherein the IC comprises interconnect resources, wherein a first type of the interconnect resources is dedicated to interface with adjacent logical components and a second type of the interconnect resources is used to connect non-adjacent circuitry to each other, wherein the first type of interconnect resources are part of the plurality of predefined deactivated regions but the second type of interconnect resources are not.

13. The system of claim 12, wherein the second type of the interconnect resources comprises interconnect tiles used to connect non-adjacent circuitry, wherein the interconnect tiles permit signals to be routed through the plurality of predefined deactivated regions to active non-adjacent circuitry disposed on opposite sides of the plurality of predefined deactivated regions.

14. The system of claim 11, wherein the plurality of predefined deactivated regions in each of the plurality of predefined variants are non- overlapping with the plurality of predefined deactivated regions in each of the other plurality of predefined variants.

15. The system of claim 14, wherein a union of the plurality of predefined deactivated regions of the plurality of predefined variants covers an entire area of the IC, except for areas of the IC containing circuitry that is excluded from the plurality of predefined deactivated regions of each of the plurality of predefined variants.

16. A non-transitory computer readable storage medium encoding instructions, which, when executed by a processor, perform an operation, the operation comprising:
identifying a defect in an integrated circuit (IC);
identifying a first variant of a plurality of predefined variants of the IC that includes a predefined deactivated region that covers the defect, wherein each of the plurality of predefined variants includes a plurality of predefined deactivated regions that are non-contiguous, wherein a size of each of the plurality of predefined deactivated regions permits signals to be routed through each of the plurality of predefined deactivated regions; and
assigning the IC to the first variant.

17. The non-transitory computer readable storage medium of claim 16, wherein the IC comprises interconnect resources, wherein a first type of the interconnect resources is dedicated to interface with adjacent logical components and a second type of the interconnect resources is used to connect non-adjacent circuitry to each other, wherein the first type of interconnect resources are part of the plurality of predefined deactivated regions but the second type of interconnect resources are not.

18. The non-transitory computer readable storage medium of claim 17, wherein the second type of the interconnect resources comprises interconnect tiles used to connect non-adjacent circuitry, wherein the interconnect tiles permit signals to be routed through the plurality of predefined deactivated regions to active non-adjacent circuitry disposed on opposite sides of the plurality of predefined deactivated regions.

19. The non-transitory computer readable storage medium of claim 16, wherein the plurality of predefined deactivated regions in each of the plurality of predefined variants are non-overlapping with the plurality of predefined deactivated regions in each of the other plurality of predefined variants.

20. The non-transitory computer readable storage medium of claim 19, wherein a union of the plurality of predefined deactivated regions of the plurality of predefined variants covers an entire area of the IC, except for areas of the IC containing circuitry that is excluded from the plurality of predefined deactivated regions of each of the plurality of predefined variants.

* * * * *